(12) United States Patent
Cao (10) Patent No.: US 7,598,788 B2
(45) Date of Patent: Oct. 6, 2009

(54) CURRENT-CONTROLLED CMOS (C3MOS) FULLY DIFFERENTIAL INTEGRATED DELAY CELL WITH VARIABLE DELAY AND HIGH BANDWIDTH

(75) Inventor: Jun Cao, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/320,401

(22) Filed: Dec. 28, 2005

(65) Prior Publication Data

US 2007/0052467 A1 Mar. 8, 2007

Related U.S. Application Data

(60) Provisional application No. 60/714,814, filed on Sep. 6, 2005.

(51) Int. Cl.
*H03H 11/26* (2006.01)

(52) U.S. Cl. ........................ 327/266; 327/274; 327/280; 327/287

(58) Field of Classification Search ................. 327/266, 327/274, 280, 287
See application file for complete search history.

(56) References Cited

U.S. PATENT DOCUMENTS

| | | | |
|---|---|---|---|
| 3,569,732 A | 3/1971 | Christensen | |
| 4,333,020 A | 6/1982 | Maeder | |
| 4,395,774 A | 7/1983 | Rapp | |
| 4,449,248 A | 5/1984 | Leslie et al. | |
| 4,519,068 A | 5/1985 | Krebs et al. | |
| 4,545,023 A | 10/1985 | Mizzi | |
| 4,599,526 A | 7/1986 | Paski | |
| 4,649,293 A | 3/1987 | Ducourant | |
| 4,680,787 A | 7/1987 | Marry | |
| 4,727,309 A | 2/1988 | Vajdic et al. | |
| 4,731,796 A | 3/1988 | Masterson et al. | |
| 4,737,975 A | 4/1988 | Shafer | |
| 4,761,822 A | 8/1988 | Maile | |
| 4,777,657 A | 10/1988 | Gillaspie | |
| 4,794,649 A | 12/1988 | Fujiwara | |
| 4,804,954 A | 2/1989 | Macnak et al. | |

(Continued)

FOREIGN PATENT DOCUMENTS

EP 0685933 6/1995

(Continued)

OTHER PUBLICATIONS

Buhanan, "CML and Flip TAB Joint Forces in the DPS 88's Micropackages," Electronics, (Nov. 3, 1982).

(Continued)

*Primary Examiner*—Kenneth B. Wells
(74) *Attorney, Agent, or Firm*—Garlick Harrison & Markison; Shayne X. Short (57) ABSTRACT

Current-controlled CMOS (C3MOS) fully differential integrated delay cell with variable delay and high bandwidth. A novel implementation includes a wideband differential transistor pair and a cross-coupled differential transistor pair. The wideband differential transistor pair can be implemented with appropriate input and output impedances to extend its bandwidth for use in broadband applications. These two stages, (1) buffer stage (or data amplifier stage) and (2) cross-coupled differential pair stage, are both very fast operating stages. This design does not incur any increased loading to previous or subsequent stages in a device. In addition, there is no increase in the total amount of current that is required.

20 Claims, 6 Drawing Sheets

U.S. PATENT DOCUMENTS

| | | | |
|---|---|---|---|
| 4,806,796 A | 2/1989 | Bushey et al. | |
| 4,807,282 A | 2/1989 | Kazan et al. | |
| 4,817,115 A | 3/1989 | Campo et al. | |
| 4,850,009 A | 7/1989 | Zook et al. | |
| 4,890,832 A | 1/1990 | Zomaki | |
| 4,894,792 A | 1/1990 | Mitchell et al. | |
| 4,916,441 A | 4/1990 | Gombrich | |
| 4,964,121 A | 10/1990 | Moore | |
| 4,969,206 A | 11/1990 | Desrochers | |
| 4,970,406 A | 11/1990 | Fitzpatrick et al. | |
| 4,977,611 A | 12/1990 | Maru | |
| 4,995,099 A | 2/1991 | Davis | |
| 5,008,879 A | 4/1991 | Fischer et al. | |
| 5,025,486 A | 6/1991 | Klughart | |
| 5,029,183 A | 7/1991 | Tymes | |
| 5,031,231 A | 7/1991 | Miyaski | |
| 5,033,109 A | 7/1991 | Kawano et al. | |
| 5,041,740 A | 8/1991 | Smith | |
| 5,055,659 A | 10/1991 | Hendrick et al. | |
| 5,055,660 A | 10/1991 | Bertagna et al. | |
| 5,079,452 A | 1/1992 | Lain et al. | |
| 5,081,402 A | 1/1992 | Koleda | |
| 5,087,099 A | 2/1992 | Stolarczyk | |
| 5,115,151 A | 5/1992 | Hull et al. | |
| 5,117,501 A | 5/1992 | Childress et al. | |
| 5,119,502 A | 6/1992 | Kallin et al. | |
| 5,121,408 A | 6/1992 | Cai et al. | |
| 5,123,029 A | 6/1992 | Bantz et al. | |
| 5,128,938 A | 7/1992 | Borras | |
| 5,134,347 A | 7/1992 | Koleda | |
| 5,142,573 A | 8/1992 | Umezawa | |
| 5,150,361 A | 9/1992 | Wieczorek et al. | |
| 5,152,006 A | 9/1992 | Klaus | |
| 5,153,878 A | 10/1992 | Krebs | |
| 5,175,870 A | 12/1992 | Mabey et al. | |
| 5,177,378 A | 1/1993 | Nagasawa | |
| 5,179,721 A | 1/1993 | Comroe et al. | |
| 5,181,200 A | 1/1993 | Harrison | |
| 5,196,805 A * | 3/1993 | Beckwith et al. | 330/54 |
| 5,216,295 A * | 6/1993 | Hoang | 326/115 |
| 5,230,084 A | 7/1993 | Nguyen | |
| 5,239,662 A | 8/1993 | Danielson et al. | |
| 5,241,542 A | 8/1993 | Natarajan et al. | |
| 5,241,691 A | 8/1993 | Owen | |
| 5,247,656 A | 9/1993 | Kabuo et al. | |
| 5,249,220 A | 9/1993 | Moskowitz et al. | |
| 5,249,302 A | 9/1993 | Metroka et al. | |
| 5,265,238 A | 11/1993 | Canova, Jr. et al. | |
| 5,265,270 A | 11/1993 | Stengel et al. | |
| 5,274,666 A | 12/1993 | Dowdell et al. | |
| 5,276,680 A | 1/1994 | Messenger | |
| 5,278,831 A | 1/1994 | Mbey et al. | |
| 5,289,055 A | 2/1994 | Razavi | |
| 5,289,469 A | 2/1994 | Tanaka | |
| 5,291,516 A | 3/1994 | Dixon et al. | |
| 5,293,639 A | 3/1994 | Wilson et al. | |
| 5,296,849 A | 3/1994 | Ide | |
| 5,297,144 A | 3/1994 | Gilbert et al. | |
| 5,301,196 A | 4/1994 | Ewen et al. | |
| 5,323,392 A | 6/1994 | Ishii et al. | |
| 5,331,509 A | 7/1994 | Kikinis | |
| 5,345,449 A | 9/1994 | Buckingham et al. | |
| 5,349,649 A | 9/1994 | Iijima | |
| 5,361,397 A | 11/1994 | Wright | |
| 5,363,121 A | 11/1994 | Freund | |
| 5,373,149 A | 12/1994 | Rasmussen | |
| 5,373,506 A | 12/1994 | Tayloe et al. | |
| 5,390,206 A | 2/1995 | Rein et al. | |
| 5,392,023 A | 2/1995 | D'Avello et al. | |
| 5,406,615 A | 4/1995 | Miller, II et al. | |
| 5,406,643 A | 4/1995 | Burke et al. | |
| 5,418,837 A | 5/1995 | Johansson et al. | |
| 5,420,529 A | 5/1995 | Guay et al. | |
| 5,423,002 A | 6/1995 | Hart | |
| 5,426,637 A | 6/1995 | Derby et al. | |
| 5,428,636 A | 6/1995 | Meier | |
| 5,430,845 A | 7/1995 | Rimmer et al. | |
| 5,434,518 A | 7/1995 | Sinh et al. | |
| 5,438,329 A | 8/1995 | Gastouniotis et al. | |
| 5,440,560 A | 8/1995 | Rypinski | |
| 5,457,412 A | 10/1995 | Tamba et al. | |
| 5,459,412 A | 10/1995 | Mentzer | |
| 5,465,081 A | 11/1995 | Todd | |
| 5,481,265 A | 1/1996 | Russell | |
| 5,481,562 A | 1/1996 | Pearson et al. | |
| 5,510,734 A | 4/1996 | Sone | |
| 5,510,748 A | 4/1996 | Erhart et al. | |
| 5,521,530 A | 5/1996 | Yao et al. | |
| 5,526,314 A * | 6/1996 | Kumar | 365/207 |
| 5,533,029 A | 7/1996 | Gardner | |
| 5,535,373 A | 7/1996 | Oinowich | |
| 5,544,222 A | 8/1996 | Robinson et al. | |
| 5,548,230 A | 8/1996 | Gerson et al. | |
| 5,576,644 A | 11/1996 | Pelella | |
| 5,579,487 A | 11/1996 | Meyerson et al. | |
| 5,584,048 A | 12/1996 | Wieczorek | |
| 5,600,267 A | 2/1997 | Wong et al. | |
| 5,606,268 A | 2/1997 | Van Brunt | |
| 5,614,841 A | 3/1997 | Marbot et al. | |
| 5,625,308 A * | 4/1997 | Matsumoto et al. | 327/203 |
| 5,630,061 A | 5/1997 | Richter et al. | |
| 5,640,356 A | 6/1997 | Gibbs | |
| 5,675,584 A | 10/1997 | Jeong | |
| 5,680,633 A | 10/1997 | Koenck et al. | |
| 5,708,399 A | 1/1998 | Fujii et al. | |
| 5,724,361 A | 3/1998 | Fiedler | |
| 5,732,346 A | 3/1998 | Lazaridis et al. | |
| 5,740,366 A | 4/1998 | Mahany et al. | |
| 5,744,366 A | 4/1998 | Kricka et al. | |
| 5,767,699 A | 6/1998 | Bosnyak et al. | |
| 5,796,727 A | 8/1998 | Harrison et al. | |
| 5,798,658 A | 8/1998 | Werking | |
| 5,821,809 A | 10/1998 | Boerstler et al. | |
| 5,839,051 A | 11/1998 | Grimmett et al. | |
| 5,877,642 A | 3/1999 | Takahashi | |
| 5,892,382 A | 4/1999 | Ueda et al. | |
| 5,903,176 A | 5/1999 | Westgate | |
| 5,905,386 A | 5/1999 | Gerson | |
| 5,940,771 A | 8/1999 | Golnick et al. | |
| 5,945,847 A * | 8/1999 | Ransijn | 326/115 |
| 5,945,858 A | 8/1999 | Sato | |
| 5,945,863 A | 8/1999 | Coy | |
| 5,969,556 A | 10/1999 | Hayakawa | |
| 5,994,939 A * | 11/1999 | Johnson et al. | 327/280 |
| 6,002,279 A | 12/1999 | Evans et al. | |
| 6,014,041 A | 1/2000 | Somasekhar et al. | |
| 6,014,705 A | 1/2000 | Koenck et al. | |
| 6,028,454 A | 2/2000 | Elmasry et al. | |
| 6,037,841 A | 3/2000 | Tanjii et al. | |
| 6,037,842 A | 3/2000 | Bryan et al. | |
| 6,038,254 A | 3/2000 | Ferraiolo et al. | |
| 6,060,951 A | 5/2000 | Inoue | |
| 6,061,747 A | 5/2000 | Ducaroir et al. | |
| 6,081,162 A | 6/2000 | Johnson | |
| 6,094,074 A | 7/2000 | Chi | |
| 6,104,214 A | 8/2000 | Ueda et al. | |
| 6,111,425 A | 8/2000 | Bertin et al. | |
| 6,114,843 A | 9/2000 | Olah | |
| 6,188,339 B1 | 2/2001 | Hasegawa | |
| 6,194,950 B1 | 2/2001 | Kibar | |
| 6,222,380 B1 | 4/2001 | Gerowitz et al. | |
| 6,232,844 B1 | 5/2001 | Talaga, Jr. | |
| 6,255,881 B1 * | 7/2001 | Balistreri et al. | 327/280 |
| 6,259,312 B1 | 7/2001 | Murtojarvi | |

| | | | |
|---|---|---|---|
| 6,259,321 B1 | 7/2001 | Song et al. | |
| 6,265,898 B1 | 7/2001 | Bellaouar | |
| 6,310,501 B1 | 10/2001 | Yamashita | |
| 6,320,422 B1 * | 11/2001 | Koh | 326/115 |
| 6,366,166 B1 | 4/2002 | Belot | |
| 6,374,311 B1 | 4/2002 | Mahany et al. | |
| 6,377,095 B1 * | 4/2002 | Kuo | 327/170 |
| 6,414,558 B1 | 7/2002 | Ryan et al. | |
| 6,417,737 B1 * | 7/2002 | Moloudi et al. | 330/301 |
| 6,424,194 B1 | 7/2002 | Hairapetian | |
| 6,429,692 B1 * | 8/2002 | Chan et al. | 326/127 |
| 6,456,122 B1 * | 9/2002 | Park et al. | 327/55 |
| 6,462,590 B2 * | 10/2002 | Warwar | 327/108 |
| 6,463,092 B1 | 10/2002 | Kim | |
| 6,559,693 B2 * | 5/2003 | Tung et al. | 327/115 |
| 6,566,720 B2 | 5/2003 | Aldrich | |
| 6,624,699 B2 * | 9/2003 | Yin et al. | 330/260 |
| 6,686,787 B2 * | 2/2004 | Ling | 327/203 |
| 6,686,788 B2 * | 2/2004 | Kim et al. | 327/280 |
| 6,774,721 B1 | 8/2004 | Popescu et al. | |
| 6,864,558 B2 | 3/2005 | Momtaz et al. | |
| 6,909,309 B2 * | 6/2005 | Green | 326/115 |
| 6,911,857 B1 * | 6/2005 | Stiff | 327/281 |
| 7,256,646 B2 * | 8/2007 | Eid et al. | 327/563 |
| 2002/0017921 A1 | 2/2002 | Green | |
| 2003/0034843 A1 | 2/2003 | Fanous et al. | |
| 2004/0104746 A1 | 6/2004 | Kim et al. | |
| 2005/0015638 A1 | 1/2005 | Zhang | |
| 2005/0093628 A1 | 5/2005 | Chen | |
| 2005/0110525 A1 | 5/2005 | Chen | |

FOREIGN PATENT DOCUMENTS

| | | |
|---|---|---|
| EP | 1 306 970 A2 | 6/2002 |
| EP | 1420511 A | 5/2004 |
| WO | WO 81/01780 | 6/1981 |
| WO | WO 0163767 | 8/2001 |

OTHER PUBLICATIONS

Chu et al.: "A comparison of CMOS circuit techniques: Differential cascode voltage switch logic versus conventional logic" IEEE Journal of Solid-State Circuits, vol. SC-22(4) pp. 528-532, (Aug. 1987).
Gray et al., "Analysis and Design of Analog Integrated Circuits," John Wiley Sons, Inc., pp. 704-709, (1977).
Harrold, "An Introduction to GaAs IC Design," Prentice Hall International, UK Ltd., pp. 43-45, 63, 160, (1993).
Heller et al.: "Cascade voltage switch logic: A differential CMOS logic family", IEEE International Solid-State Circuits Conference, pp. 16-17 (Feb. 22, 1984).
Hodges et al., "Analysis and Design of Digital Integrated Circuits." McGraw Hill, Inc., pp. 271-283, (1983).
Katsu et al., "A GaAs Monolithic Frequency Divider Using Source Coupled FET Logic," IEEE Electron Device Letters,vol. EDL-3, No. 8, (Aug. 1, 1982).
Katsu et al., "A Source Coupled FET Logic-A New Current-Mode Approach to GaAs Logics," IEEE Transactions on Electron Devices, vol. ED-32, No. 6, (Jun. 1985).
Lee, T. "The Design of CMOS Radio-Frequency Integrated Circuits," 1998, Cambridge Press, New York, N.Y., pp. 178-185.
Pfennings et al.: "Differential split-level CMOS logic for subnanosecond speeds", IEEE Journal of Solid-State Circuits, vol. SC-20(5), pp. 1050-1055, (Oct. 1985).
Rudell, J. et al., "A 1.9-GHz Wide-Band IF Double Conversion CMOS Receiver for Cordless Telephone Applications" IEEE Journal of Solid State Circuits, vol. 32(12), pp. 2071-2088, Dec. 1997.
Somasekhar and Kaushik, "Differential current switch logic a power DCVS logic family" IEEE Journal of SolidState Circuits, vol. 31(7), pp. 981-991, (Jul. 1996).
Yamashina and Yamada, "An MOS current mode logic (MCML) Circuits for low-power Sub-GHz Processors" IEICE Trans. Electron., vol. E75-C(10) pp. 1181-1187, (Oct. 1992).

Yamashina and Yamada, "An MOS current mode logic (MCML) Circuit for low-power Sub-GHz Processors" NEC Res. Develop., vol. 36(1), pp. 54-63, (Jan. 1995).
Bida, A Hybrid Wireless MAC Protocol Supporting Asynchronous and Synchronous MSDU Delivery Services, IEEE 802.11191-92, Sep. 1991, pp. 1-46.
Robert Meier's Master's Thesis, Mobile Computer Network Architecture, (May 1993), 82 pages.
Hoberecht, A Layered network Protocol for Packet Voice and Data Integration, IEEE Journal on Selected Areas in Communications, vol. SAC-1, No. 6 (Dec. 1983), pp. 1006-1013.
Rypinski, Architecture-Topology and Protocol Stacks, IEEE 802.11191-21, Mar. 1991, 12 pages.
Cheah, A Proposed Architecture and Access Protocol Outline for the IEEE 802.11 Radio LAN Standards, Document IEEE P802.11191-54, May 1991; pp. 1-20.
Rypinski, Power-Drain Considerations for Full Time and Sleep Mode Radio Receivers, IEEE P802.11191-99, Sep. 1991, 11 pages.
Natarajan et al, Battery Efficient Operation of Radio MAC Protocol, IEEE P802.11191-102, Sep. 1991, pp. 1-5.
Cox, A Radio System Proposal for Widespread Low-Power Tetherless Communications, IEEE Transactions on Communications, vol. 39, No. 2 (Feb. 1991), pp. 324-335.
Bagby, One Approach to Wireless Network Architecture, IEEE P802.11191-2, Jan. 1991, 1-15, 17-21.
Biba, A Modest Proposal for a Asynchronous, Data Intensive, Wireless Local Area Network, IEEE P802.11191-25, Mar. 1991; pp. 1-25.
Heimschi et al; Merged CMOS/Bipolar Current Switch Logic (MCSL), IEEE Journal of Solid State Circuits, vol. 24, pp. 1307-1311, Oct. 1989.
Elrabaa et al; Optimization of Digital BiCMOS Circuits, An Overview, IEEE 1992, 5 pages.
Mudd et al, Very High Speed ECLICMG Gate Arrays with Submicron Structures; IEEE 1989, 5 pages.
Mizuno, et al., "A GHZ MOS Adaptive Pipeline Technique Using MOS Current-Mode Logic," IEEE Journal of Solid-State Circuits, vol. 31, No. 6, pp. 784-791, (Jun. 1996).
Yamashina, et al., "A Low-Supply Voltage GHz MOS Integrated Circuit for Mobile Computing Systems," IEEE Symposium on Low Power Electronics, pp. 8CL81, (1994). Atkinson, A Single Chip Radio Transceiver for DECT, IEEE 1997.
Mizuno, A GHzMOS Adaptive Pipeline Technique Using MOS Current-Mode Logic, IEEE Journal of SolidState Circuits, vol. 31, No. 6, pp. 784-791 (Jun. 1996).
Heimsch, Merged CMOS-Bipolar Current Switch Logic (MCSL), IEEE Journal of SolidState Circuits, vol. 24, No. 5, pp. 1307-1311 (Oct. 1989).
Elrabaa, Optimization of Digital BiCMOS Circuits, An Overview, IEEE 1992.
Elrabaa, Multimitter BiCMOS CML Circuits, IEEE Journal of Solid-State Circuits, vol. 27, No. 3, pp. 454-458 (Mar. 1992).
Ewen et al., Single-Chip 1062Mbaud CMOS Transceiver for Serial Data Communication, 1995 IEEE International Solid-State Circuits Conference Digest of Technical Papers, pp. 32-33, 336.
Chen and Waldron, A Single-Chip 266Mbls CMOS Transmitter|Receiver for Serial Data Communications, 1993 IEEE International Solid-State Circuits Conference Digest of Technical Papers, pp. 100-101, 269.
Oshima et al., A Single CMOS SDH Terminal Chip for 622 Mbls STM 4C, 1994 IEEE International SolidState Circuits Conference Digest of Technical Papers, pp. 174-175.
Widmer et al., Single-Chip 4xSOOMbaud CMOS Transceiver, 1996 IEEE International SolidState Circuits Conference Digest of Technical Papers, pp. 126-127, 430.
Lee et al., A CMOS Serial Link for 1 Gbaud Fully Duplexed Data Communication, 1994 Symposium on VLSI Circuits Digest of Technical Papers, pp. 125-126.
Lee et al., A CMOS Serial Link for Fully Duplexed Data Communication, IEEE Journal of Solid-State Circuits, vol. 30, pp. 353-364 (Apr. 1995).
Djahanshahi et al., High-speed ECL-Compatible Serial I/O in 0.35μm CMOS, IEEE 1998.

Fukaishi et al., A 4.25-Gb|s CMOS Fiber Channel Transceiver with Asynchronous Tree-Type Demultiplexer and Frequency Conversion Architecture, IEEE Journal of Solid-state Circuits, vol. 33 No. 12, pp. 2139-2147 (1998).

Madhavan and Levi, Low-Power 2.5 Gbit|s VCSEL driver in 0.5µm CMOS technology, Electronics Letters, vol. 34 No. 2 pp. 178-179 (Jan. 1998).

Chen and Barker; A 1.25Gb/s, 460mW CMOS Transceiver for Serial Data Communication, 1997 IEEE International Solid-state Circuits Conference pp. 242-243, 465.

Runge and Thomas, 5Gbit/s 2:1 multiplexer fabricated in 0.35µm CMOS and 3Gbit/s 1:2 demultiplexer fabricated in 0.5µm CMOS technology, Electronics Letters, vol. 35 No. 19.pp. 163 1-33 (Sep. 1999).

Fiedler et al., A 1.0625Gbps Transceiver with 2x-Oversampling and Transmit Signal Pre-Emphasis, 1997 IEEE International Solid- state Circuits Conference pp. 238-239,464.

Widmer et al., Single-Chip 4x5OCLMEd CMOS Transceiver, IEEE Journal of Solid-state Circuits, vol. 31 No. 12 pp. 2004-2014 (1996).

Kurisu et al., 2.8Gb/s 176mW Byte-Interleaved and 3.0 Gb|s 118mW Bit-Interleaved 8:1 Multiplexers, 1996 International Solid state Circuits Conference pp. 122-123, 429.

Friedman et al, A Baseband Processor for IS-54 Cellular Telephony, IEEE Journal of Solid-state Circuits, vol. 31 No. 5 pp. 646-655 (May 1996).

Ewen et al., CMOS circuits for Gb|s serial data communication, IBM J. Res. Develop., vol. 39 No. 12 pp. 73-81 (Mar. 1995).

Thompson et al., A 300-MHz BiCMOS Serial Data Transceiver, IEEE Journal of Solid-state Circuits, vol. 29 No. 3 pp. 185-192 (1994).

Yuen et al., An ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbit|s Bandwidth Multiplexerf/Demultiplexer CMOS Chip, 1992 Symposium on VLSI Circuits Digest of Technical Papers pp. 68-69.

Navarro and Van Noije, Design of an 8:I MUX at 1.7Gbit/s in 0.8µm CMOS Technology, 1998 Great Lakes Symposium on VLSI.

Pederson and Metz, A CMOS to IOOK ECL Interface Circuit, 1989 IEEE International Solid-state Circuits Conference pp. 226-227, 345.

Baumert et al., A Monolithic 50-200 MHz CMOS Clock Recovery and Retiming Circuit, IEEE 1989 Custom Integrated Circuits Conference pp. 14.5.1-14.5.4, (May 1989).

Atkinson, A Single Chip Radio Transceiver for DECT, IEEE 1997.

Klose, Process-Optimization for Sub-30ps BiCMOS Technologies for Mixed ECLICMOS Applications, IEEE 1991.

Leung D L C et al: "A 3-V CMOS differential bandpass amplifier for GSM receivers" Circuits and Systems, 1998. ISCAS '98. Proceedings of the 1998 IEEE International Symposium on Monterey, CA. USA May 31-Jun. 1, 1998, New York, NY, USA, IEEE, US, May 31, 1998, pp. 341-344, XPO10289447 ISBN: 0-7803-4455-3 *figure 5*.

Qiang Li et al Institute of Electrical and Electronics Engineers: "RF circuit performance degradation due to soft breakdown and hot carrier, effect in 0.18 /sp mu/m CMOS technology"2001 IEEE Radio Frequency Integrated Circuits (RFIC) Symposium. Digest of Papers. Phoenix, AZ, May 20-22, 2001. IEEE Radio Frequency Integrated Circuits Symposium, New York, NY : IEEE. US, May 20, 2001. pp. 139-142, XP010551339 ISBN: 0-7803-6601-8 * figure 3 *.

Razavi B Ed-Institute of Electrical and Electronics Engineers: "Prospects Of CMOS Technology For High-Speed Oplical Communication Circuits" GaAs IC symposium. 23rd. Annual IEEE Gallium Arsenide Integrated Circuit Symposium. Technical digest 2001. Baltimore, MD, Oct. 21-24, 2001, GaAs IC Symposium-IEEE Gallium Arsenide Integrated Circuit Symposium, New York, NY IEEE, US, Oct. 21, 2001, pp. 3-6, XP001O46946 ISBN: 0-7803-6663-8 * figures 6a,7.

Li Q et al: "RF Circuit Performance Degradation Due to Soft Breakdown and Hot-Carrier Effect in Deep-Submicrometer CMOS Technology" IEEE Transactions on Microwave Theory and Techniques, IEEE Inc. New York, US, vol. 49, No. 9, Sep. 2001, pp. 1546-1551, XP001096604 ISSN: 0018-9480 *figure 9*.

Masakazu Yamashina, Masayuki Mizuno, Koichiro Furuta, Hiroyuki Igura, Masahiro Nomura. Hiroshi Abiko, Kazuhiro Okabe. Atsuki Ono and Hachiro Yamada, "A Low-Supply Voltage GHz MOS Integrated Circuit for Mobile Computing Systems," IEEE Symposium On Low Power Electronics, XP002386133, Oct. 1994, pp. 80-81.

European Search Report; EP06008842.4-2215, dated Jun. 22, 2009.

* cited by examiner

CURRENT-CONTROLLED CMOS (C3MOS) FULLY DIFFERENTIAL INTEGRATED DELAY CELL WITH VARIABLE DELAY AND HIGH BANDWIDTH

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/714,814, entitled "Current-controlled CMOS (C3MOS) fully differential integrated delay cell with variable delay and high bandwidth,", filed Tuesday, Sep. 6, 2005 (Sep. 6, 2005), pending.

Incorporation By Reference

The following U.S. Utility Patent Applications are hereby incorporated herein by reference in their entirety and made part of the present U.S. Utility Patent Application for all purposes:

1. U.S. Utility patent application Ser. No. 09/484,856, entitled "Current-controlled CMOS logic family,", filed Jan. 18, 2000 (Jan. 18, 2000), now U.S. Pat. No. 6,424,194 B1, issued Jul. 23, 2002 (Jul. 23, 2002).

2. U.S. Utility patent application Ser. No. 09/610,905, entitled "Current-controlled CMOS circuits with inductive broadbanding,", filed Jul. 6, 2000 (Jul. 6, 2000), now U.S. Pat. No. 6,340,899 B1, issued Jan. 22, 2002 (Jan. 22, 2002).

3. U.S. Utility patent application Ser. No. 10/028,806, entitled "Current-controlled CMOS wideband data amplifier circuits,", filed Oct. 25, 2001 (Oct. 25, 2001), now U.S. Pat. No. 6,624,699 B2, issued Sep. 23, 2003 (Sep. 23, 2003).

BACKGROUND OF THE INVENTION

1. Technical Field of the Invention

The invention relates generally to the field of communication devices; and, more particularly, it relates to the field of delay cells that can be implemented within such communication devices.

2. Description of Related Art

Data communication systems have been under continual development for many years. In many broadband data communication system application, variable delay cells are employed. In such applications, it is oftentimes desirable to adjust timing control between various components. One such possible implementation of a delay cell is within the context of a delay locked loop (DLL). A common approach to designing a DLL is to employ a number of delay blocks. In the prior art, each of the individual delay blocks can be undesirably power consumptive. It would be desirable to have a delay block design that is more energy efficient.

For appropriate alignment and control of the various components within a communication system, it is very often desirable to ensure having some means by which the various signal therein can be adjusted to ensure proper alignment and timing. As such, there has been and continues to be a need for better and more efficient means by which delay cells may be implemented within communication systems and within various communication devices within such communication systems.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Various embodiments of the invention provide for ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel, implemented using NMOS (Negative-Channel Metal-Oxide Semiconductor) transistors or PMOS (Positive-Channel Metal-Oxide Semiconductor) transistors) to form various logic gates and more complex logic circuitry, wherein zero static current is dissipated. Embodiments of the invention use current-controlled mechanisms to develop a family of very fast current-controlled CMOS (C3MOS or C³MOS™) logic that can be fabricated using a variety of conventional CMOS process technologies, but that unlike conventional CMOS logic does dissipate static current. C3MOS logic or current-controlled metal-oxide-semiconductor field-effect transistor (MOSFET) logic are used herein interchangeably.

Various C3MOS circuit techniques are described in greater detail in commonly-assigned U.S. patent application Ser. No. 09/484,856, now U.S. Pat. No. 6,424,194 B1, entitled "Current Controlled CMOS Logic Family," by A. Hairapetian, which is hereby incorporated by reference in its entirety for all purposes as indicated above.

Other techniques have been developed to increase the gain-bandwidth product of CMOS circuitry. For example, shunt peaking is one approach that has resulted in improved gain-bandwidth product. Shunt peaking involves putting an inductor in series with the output resistor to expand the bandwidth of the circuit. Such inductive broadbanding technique combined with C3MOS circuitry is described in greater detail in commonly-assigned U.S. patent application Ser. No. 09/610, 905, now U.S. Pat. No. 6,340,899 B1, entitled "Current- Controlled CMOS Circuits with Inductive Broadbanding," by M. Green, which is hereby incorporated by reference in its entirety for all purposes as indicated above.

In commonly-assigned U.S. patent application Ser. No. 10/028,806, now U.S. Pat. No. 6,624,699 B2, entitled "Current-controlled CMOS wideband data amplifier circuits," by Guangming Yin and Jun Cao, which is hereby incorporated by reference in its entirety for all purposes as indicated above, the current-controlled CMOS wideband data amplifier circuits disclosed therein having expanded bandwidth are designed to achieve such the goal of having a flat frequency response over a very wide frequency range, where maximum bandwidth expansion is achieved by using series inductor peaking with Miller capacitance cancellation technique and shunt inductor peaking in current controlled CMOS (C3MOS or Current-controlled CMOS wideband data amplifier circuits) circuits.

Figure 1:
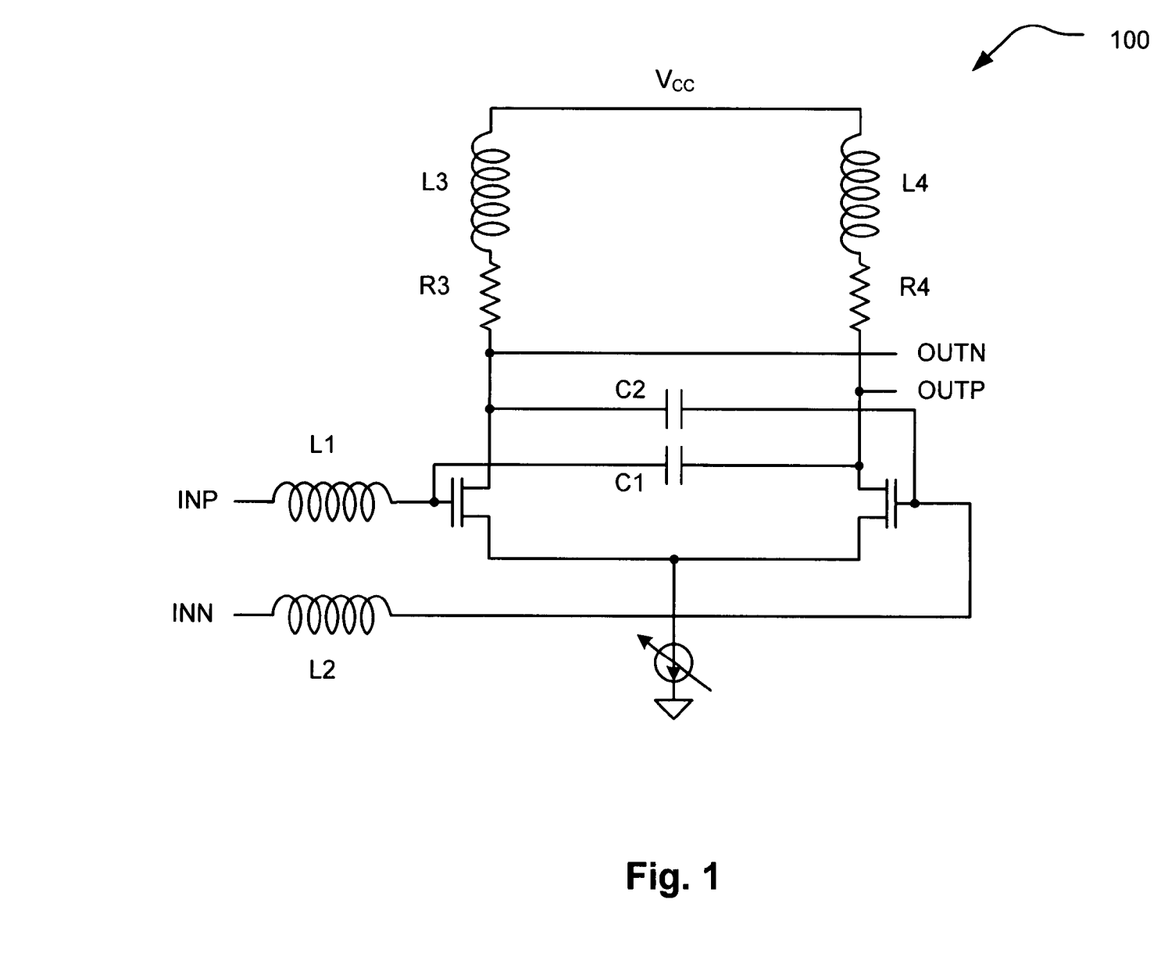
FIG. 1 illustrates an embodiment of a current-controlled CMOS (C3MOS) wideband data amplifier circuit.

FIG. 1 illustrates an embodiment 100 of a current-controlled CMOS (C3MOS) wideband data amplifier circuit. A current source transistor can be biased by a bias voltage so that a constant current flows from drain to source in the current source transistor. Two separate differential transistors compose a wideband differential transistor pair. A first differential transistor has its gate tied to the negative end of a first series peaking inductor L1, while a positive differential input signal INP is coupled to the positive end of the first series peaking inductor L1. Similarly, a second differential transistor has its gate tied to the negative end of a second series peaking inductor L2, while a negative differential input signal INN is coupled to the positive end of the second series peaking inductor L2.

Assuming that the first and second differential transistors are identical, then the first and second series peaking inductors L1 and L2 have the same inductance. A first output resistor R3 has its negative end tied to the drain of the first differential transistor, and has its positive end tied to the negative end of a first shunt peaking inductor L3. A second output resistor R4 has its negative end tied to the drain of the second differential transistor, and has its positive end tied to the negative end of a second shunt peaking inductor L4. The positive ends of the first and second shunt peaking inductors L3 and L4 are tied to the positive supply voltage (shown as $V_{CC}$).

Preferably, the first and second output resistors R3 and R4 have the same resistance value R, and the first and second shunt peaking inductors L3 and L4 have the same inductances. A first capacitor C1 (which may be referred to as a first Miller cancellation capacitor C1) has its positive end coupled to the drain of the second differential transistor, and has its negative end coupled to the gate of the first differential transistor. A second capacitor C2 (which may be referred to as a second Miller cancellation capacitor C2) has its positive end coupled to the drain of the first differential transistor, and has its negative end coupled to the gate of the second differential transistor. A first output signal OUTP is taken at the drain of the second differential transistor, and the second output signal OUTN is taken at the drain of the first differential transistor.

Input series inductors (L1 and L2) resonate with the capacitance at the input of the differential pair at high frequencies and thus extend the bandwidth of the amplifier. In addition, at high frequencies, the inductors (L1 and L2) act as high impedance chokes between the termination resistors (shown as two series connected 50 Ω resistors) and the capacitors and thus also improve the input reflection for the C3MOS wideband data amplifier circuit of this embodiment 100.

Figure 2:
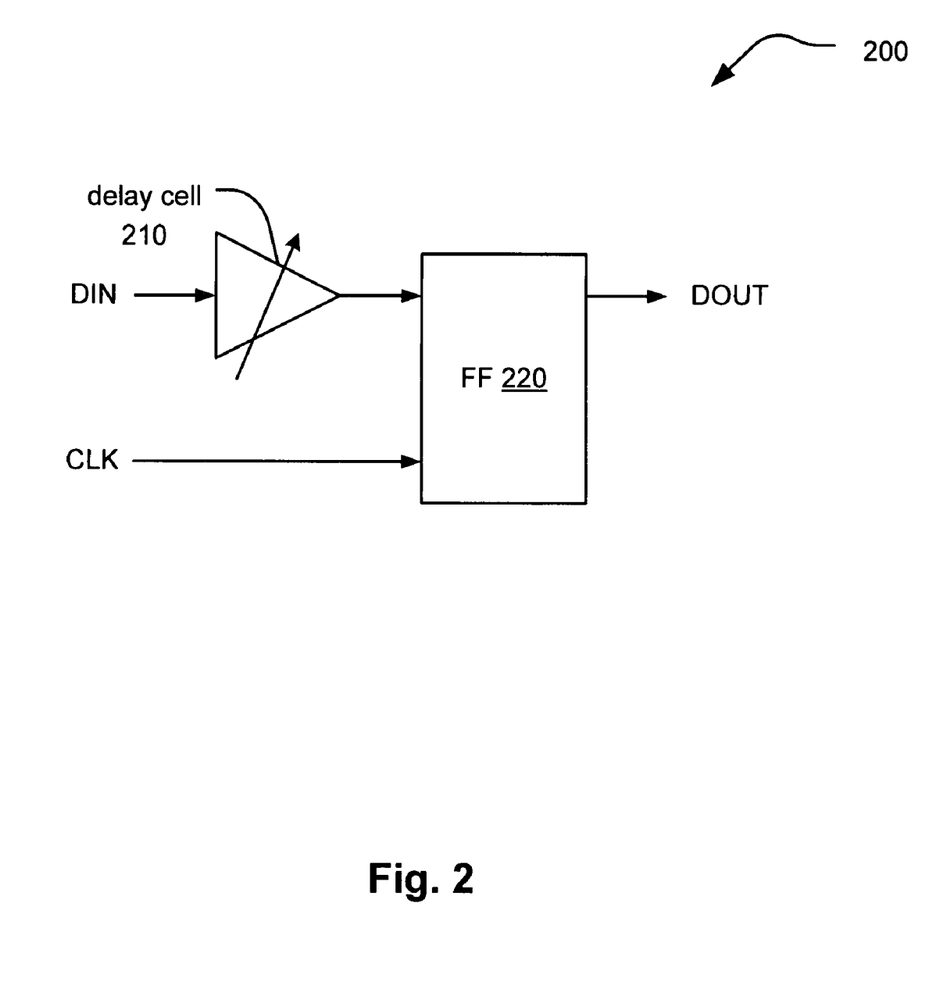
FIG. 2 illustrates an embodiment of a variable delay cell.

FIG. 2 illustrates an embodiment 200 of a variable delay cell. As mentioned above, there is a need in the art for delay cells within many broadband data communication applications. Also, variable delay cells provide for even greater flexibility and applicability than fixed delay type delay cells. This embodiment 200 shows a basic building block of a data synchronization circuit. The input data (DIN) is retimed by a flip-flop (FF) driven by a clock signal (CLK). For the FF to operate correctly, the input data (DIN) and clock (CLK) must satisfy one or more certain timing requirements. A delay cell is often inserted between the input data (DIN) and the FF so that the timing relation between the clock (CLK) and data (DIN) at the input of the FF can be adjusted to compensate for any phase variations of the input signals or circuit delay variations due to changes in process, voltage supply or temperature (PVT). As the input data (DIN) runs at an ever increasing rate, the delay cell needs to have continuously higher and higher bandwidth in order to preserve the signal integrity of the input data.

Figure 3:
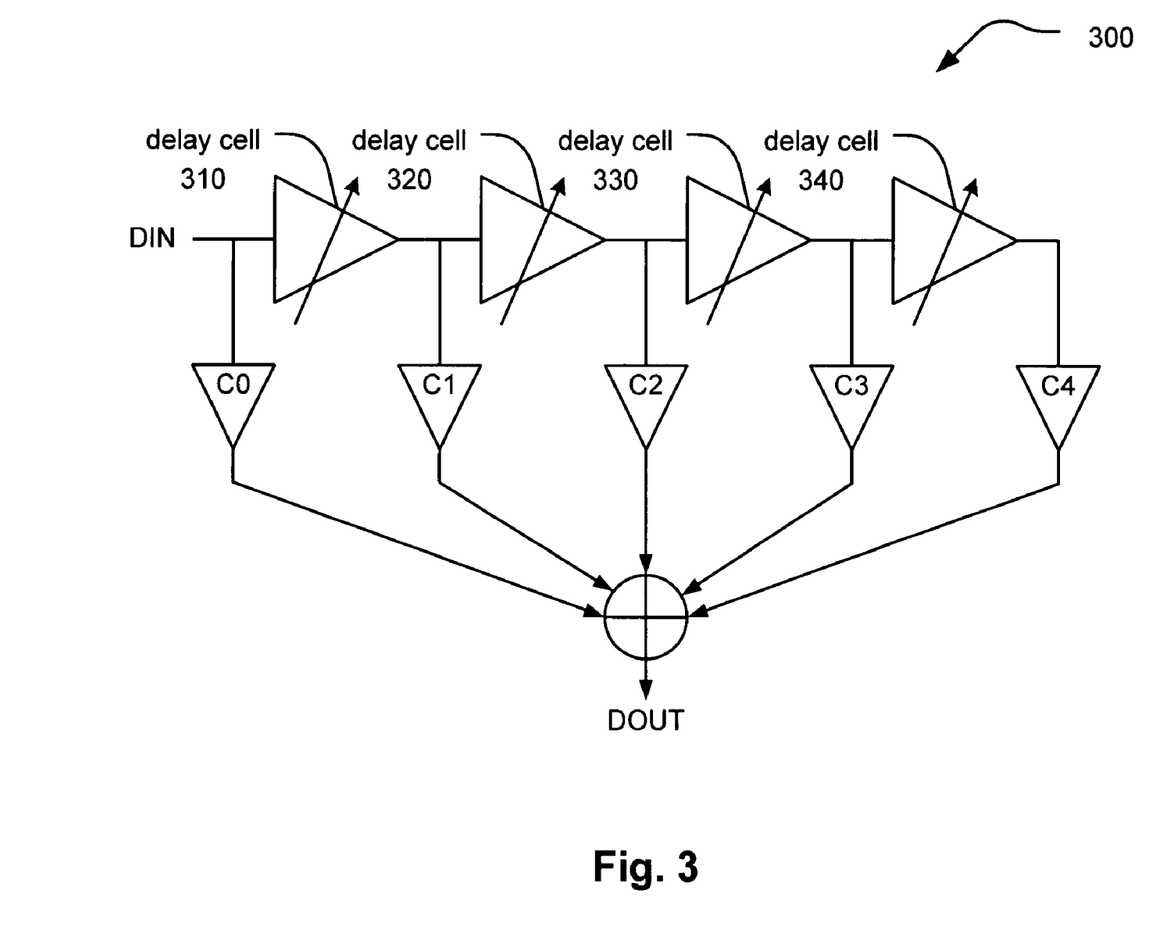
FIG. 3 illustrates another embodiment of a variable delay cell.

FIG. 3 illustrates another embodiment 300 of a variable delay cell. This embodiment 300 is another example by which a variable delay cell can be employed. The embodiment 300 is a 5-tap finite impulse response (FIR) filter that is constructed to process the input data (DIN). For the FIR filter to work as designed, each delay cell (i.e., delay cells 310, 320, 330, and 340) should have the same delay in time which is usually inversely proportional to the data rate. Similar to the embodiment 200 of the FIG. 2, variable delay cells are desirable to compensate the circuit delay variations due to changes in PVT conditions. Furthermore, if the input data rate may vary, the delay cell also needs to provide corresponding changes in delay. Since multiple delay cells (i.e., delay cells 310, 320, 330, and 340) are usually connected in tandem, it's very important for the delay cells to have relatively high bandwidth in regard to the data rate.

In the embodiment 300 of a variable delay cell implemented using a 5-tap FIR filter, a goal is to have a data stream with an equal delay (e.g., $\Delta t_n$) between each of the various components of the data stream. In the embodiment 300, there are 5 components of the data stream. Typically, this delay (e.g., $\Delta t_n$) is the same, and the delays of each of these delay cells 310, 320, 330, and 340 may be adjusted together.

Another possible embodiment by which a variable delay cell can be implemented is to add a variable capacitive load at the output of conventional data buffers (e.g., differential pairs). However, there is a fundamental limitation on such an approach. For those circuits whose small-signal transfer function can be approximated by a single-pole response, the bandwidth and delay are directly coupled together. For example, the 10%-90% rise/fall time in response to an input step equals to 0.35/BW (where BW is the −3 dB bandwidth of the small signal response of the circuit). The larger is the delay amount, then the smaller is the bandwidth. As a result, the minimum bandwidth requirement on the delay cell puts an upper limit of the delay amount if such a circuit is employed. On the other hand, the smaller is the delay amount, then the larger is the bandwidth the circuit needs to have, which usually means more power and larger area the delay cell needs to have if a simple single-pole buffer is employed.

Figure 4:
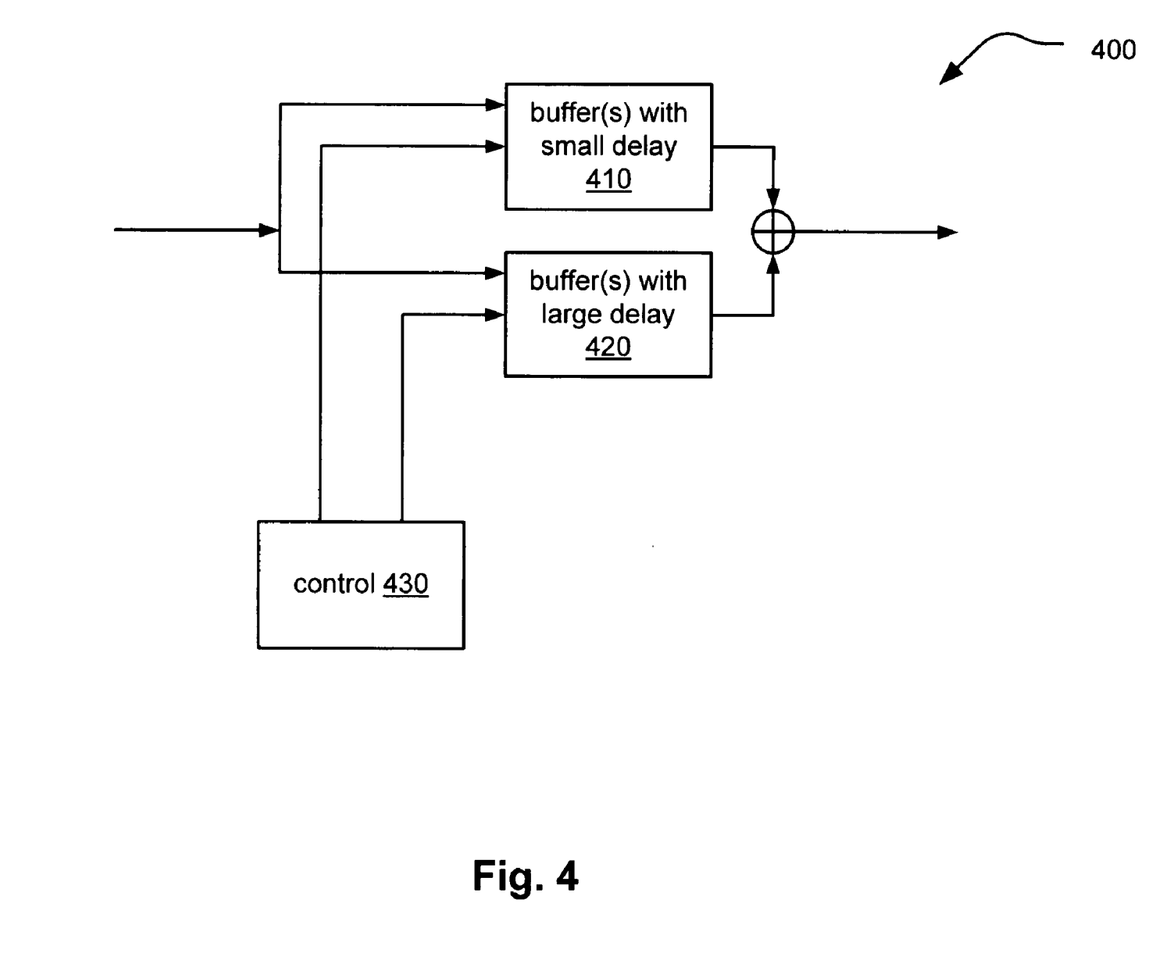
FIG. 4 illustrates an embodiment of a two-path adjustable high bandwidth delay cell.

FIG. 4 illustrates an embodiment 400 of a two-path adjustable high bandwidth delay cell. This embodiment 400 employs two separate data paths for the input data. One of the data paths has a relatively smaller amount of propagation delay (shown as buffer(s) with small delay 410), and the other of the data paths has a relatively larger amount of propagation delay (shown as buffer(s) with large delay 420). The signal passes through the two different paths are then combined together at a summing stage. The relative strength of the two paths can be adjusted (using a control block 430) and thus enable the overall data path to have a variable delay. To implement the slow path, several fast buffers can be connected in series in order to have a large enough propagation delay while preserving signal integrity.

For transmission rates of 10 Gbps (Giga-bits per second) or higher, CMOS data buffers generally consume a significant amount of power due to limitations of the technology. In the two-path embodiment 400 of the FIG. 4 for a variable delay cell, at least three high-speed blocks need to be powered up, including the summer. The summer is especially power consumptive because it has two pairs of full-rate data input which will add a significant amount lot of parasitic loading to the high speed data path. Furthermore, the input data are connected to both the quick path and the slow path. If this combined input is connected to the output of a front buffer, this configuration will significantly increase the loading to the previous stage and thus reduce the overall bandwidth of the data path. If the combined input is connected to the input pads of the chip directly, it will cause a severe degradation of the matching between the input of the receiver and the traces on the printed circuit board (PCB) due to the excessive capacitance loading. This results in large amount of reflections and will degrade the integrity of the input data significantly. Another potential issue of the two path implementation is when the signals that have been passed going through the two different paths are combined together at the summer, additional jitter may be generated if the delay between the two path differs significantly. It would be most desirable to have a high bandwidth variable delay cell that would not have increased power and loading requirements across a wide variety of applications.

The embodiment 400 mixes two types of buffers together: a slow buffer and a fast buffer. The larger delay that is required or desired in a particular application inherently incurs a lower bandwidth in the embodiment 400. The lower bandwidth in such an instance acts as a low pass filter (LPF). This LPF filtering may corrupt the signal undesirably due to the low frequency cut-off. Undesirable inter-symbol Interference (ISI) may also be introduced because of this LPF filtering. In very high speed, broadband application, such effects can significantly reduce overall performance.

Figure 5:
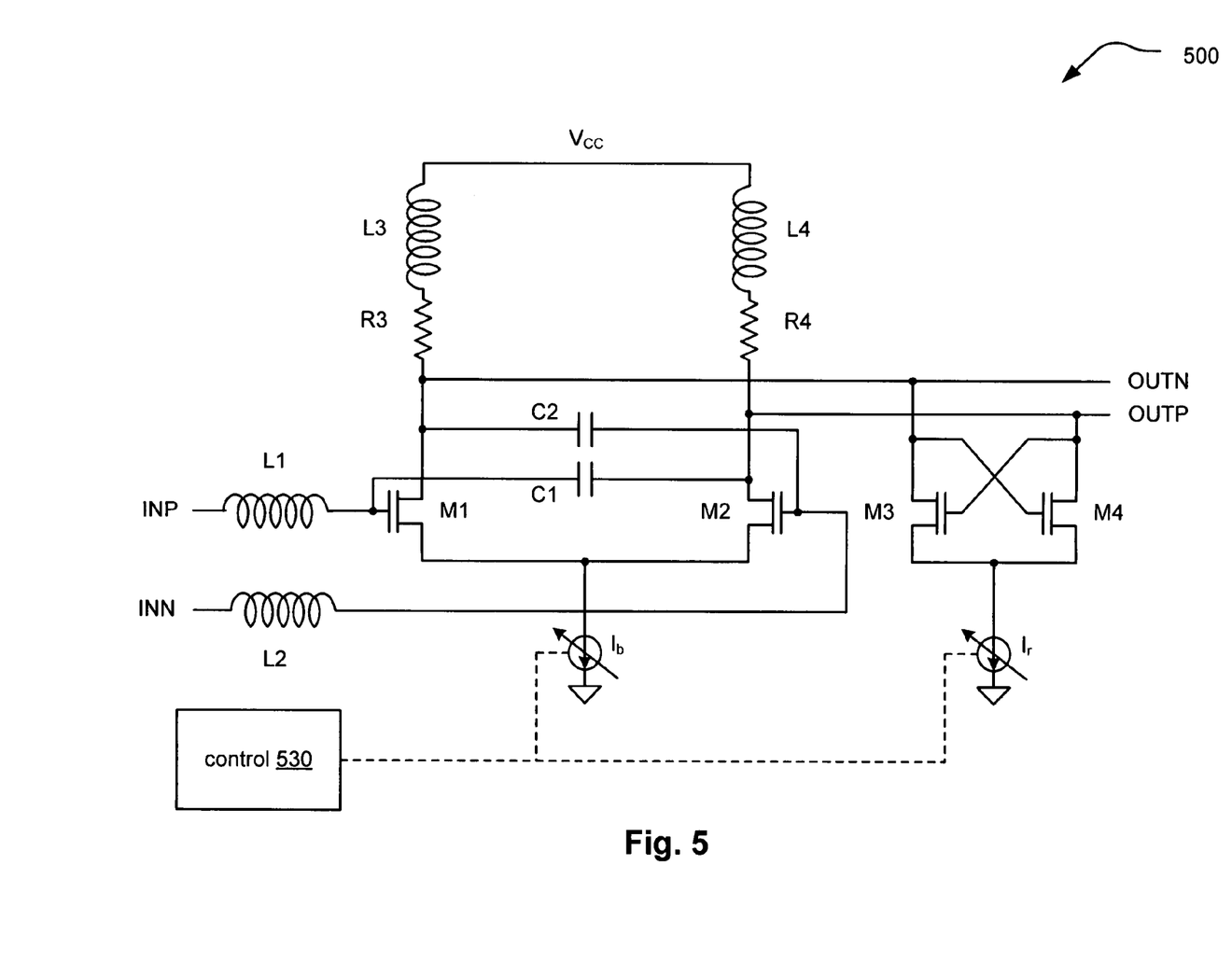
FIG. 5 illustrates an embodiment of a wideband variable delay cell.

FIG. 5 illustrates an embodiment 500 of a wideband variable delay cell. In this embodiment 500, the input of the signal is connected to a current-controlled CMOS (C3MOS) wideband data amplifier circuit having expanded bandwidth that is similar to the embodiment 100 of the FIG. 1. The operation of such a wideband data amplifier circuit having expanded bandwidth is also described in commonly-assigned U.S. patent application Ser. No. 10/028,806, now U.S. Pat. No. 6,624,699 B2, entitled "Current-controlled CMOS wideband data amplifier circuits," by Guangming Yin and Jun Cao. In such a C3MOS wideband data amplifier circuit having expanded bandwidth, maximum bandwidth expansion is achieved by using series inductor peaking with miller capacitance cancellation technique and shunt inductor peaking in current controlled CMOS circuit (C3MOS or C3MOS).

Connected to the output of the wideband data buffer having expanded bandwidth (that includes the differential transistor pair M1 and M2, i.e. a wideband differential transistor pair) is a cross-coupled differential pair (that includes the differential transistor pair M3 and M4, i.e. a cross-coupled differential transistor pair) as the regenerative stage for the data. In this embodiment 500, there are therefore two very fast operating blocks [(1) wideband data buffer and (2) cross-coupled differential pair] that operate cooperatively to perform the functionality of a wideband variable delay cell that is appropriate for broadband applications.

To vary the delay, the currents of the buffer stage and the cross-coupled differential pair stage can be adjusted (e.g., using a control block 530). When all the current passes through the buffer stage and the cross-coupled differential pair stage current source is turned off, the circuit behaves just like a wideband data amplifier having expanded bandwidth as described and referenced above (i.e., the embodiment 100 of the FIG. 1 and within U.S. Pat. No. 6,624,699 B2). With the high bandwidth achieved by various design skills, the delay through the delay cell can be very small. To increase the delay, the current going through the buffer stage is reduced and the current going through the cross-coupled differential pair stage is increased by the same amount. For the output signal to reach full swing, it has to go through the regenerative process at the cross-coupled differential pair to be amplified, and thus the delay is increased. A first-order analysis of the embodiment 500 of such a variable delay cell can be done based on a two-step approximation, as shown below.

Since the buffer stage of the variable delay cell has very high bandwidth, the delay from input to output at this stage is very small. It is reasonable to assume the delay through the buffer stage is a relatively constant value (denoted as $T_b$); the delay variation of the delay cell is mostly contributed by the regenerative process of the cross-coupled differential pair stage (denoted as $T_r$). In the two-step approximation, the signal through the delay cell is divided into two steps. In the first step, the signal $V_{in}$ is buffered by the input stage and appear at the output after a delay of $T_0$, taking a value of $V_m \cdot V_m$ is equal to the current passing through the buffer stage ($I_b$) times the load resistance (R). In the second step, the signal $V_m$ at the input of the cross-coupled differential pair goes through the positive feedback of the cross-coupled differential pair and gets regenerated until reaching the value of $V_0$, after a delay of $T_r$. The voltage, $V_0$, is a fixed value, determined by the total current ($I_0 = I_b + I_r$) and load resistance ($V_0 = R \cdot I_0$).

If it assumed that $I_b = x \cdot I_0$, then $I_r = (1-x) \cdot I_0$. The value of x can be changed between 1 and 0, where x=1 means that all the current is going through the buffer stage. At the output, which is also the input of the cross-coupled differential pair (that includes the differential transistor pair M3 and M4), after $T_0$ of delay $v_m = x \cdot I_0 \cdot R$. It is noted that the output voltage of a regenerative cross-coupled differential pair increases exponentially with time and is proportional to the initial voltage as indicated below.

$$V(t) = V_m \cdot e^{(t/\tau)}$$

where $\tau$ is the characteristic time constant of the cross-coupled differential pair, which is inversely proportional to the gain of the cross-coupled differential pair. For CMOS transistors, the gain is proportional to the square root of the biasing current in the first order as indicated below.

$$\tau = \frac{k}{\sqrt{(1-x) \cdot I_0}}$$

$$V(T_r) = V_0 = V_m \cdot e^{(T_r/\tau)}$$

$$T_r = \tau \cdot \ln\left(\frac{V_0}{V_m}\right) = -k \cdot I_0^{-0.5} \cdot (1-x)^{-0.5} \cdot \ln(x)$$

Figure 6:
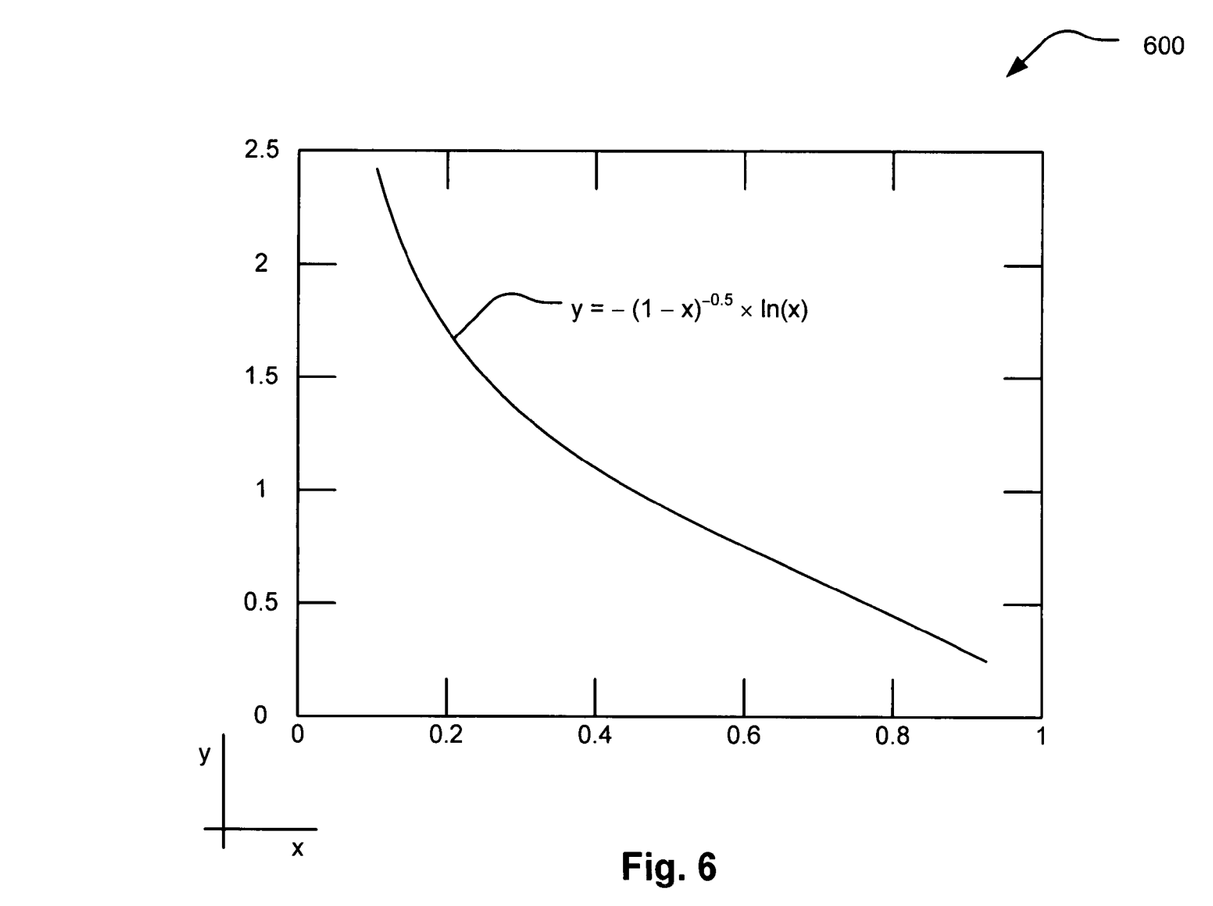
FIG. 6 illustrates an embodiment of delay through a cross-coupled differential pair (normalized) in response to current in a buffer stage (normalized).

FIG. 6 illustrates an embodiment 600 of delay through a cross-coupled differential pair (normalized) in response to current in a buffer stage (normalized). This embodiment 600 shows the normalized delay through the cross-coupled differential pair stage, $T_r/(k \cdot I_0^{-0.5})$, as a function of the normalized current in the buffer stage $$\left( x = \frac{I_b}{I_0} \right).$$

It is evident that as the current passing through the buffer stage becomes smaller, the delay through the cross-coupled differential pair stage becomes bigger. The total delay through the delay cell is $T=T_b+T_r$. Thus by changing the current distribution between the buffer stage (including the differential transistor pair M1 and M2) and cross-coupled differential pair stage (including the differential transistor pair M3 and M4) (i.e., which involves changing the value of x), the amount of the delay can be readily adjusted.

This control of the two currents, $I_b$ and $I_r$, and their relationship, may be performed using a control block (e.g., control block 530 in the embodiment 500 of the FIG. 5). It is noted that the total current ($I_0=I_b+I_r$) required in the embodiment 500 is kept constant, but merely the relationship (or relationship) between these 2 currents, $I_b$ and $I_r$, is controlled thereby controlling the overall delay. For example, a variable delay of such a variable delay cell circuit can be controlled by adjusting at least one of a first current, $I_b$, in a first variable current source and a second current, $I_r$, in the second variable current source. A variable delay of such a variable delay cell circuit can be controlled can be viewed as being a function of a ratio of a first current, $I_b$, in the first current source divided by a sum that includes the first current in the first current source and the second current in the second current source (e.g., total current ($I_0=I_b+I_r$)). Also, because this total current ($I_0=I_b+I_r$) remains unchanged, then the DC level of the delay cell output incurred by the load resistance also remains unchanged.

As the value of x approaches 1, then the total delay a variable delay cell (e.g., the embodiment 500 of the FIG. 5) approaches the delay of the wideband data buffer (that includes the differential transistor pair M1 and M2). As the value of x approaches 0 (zero), then the total delay a variable delay cell (e.g., the embodiment 500 of the FIG. 5) approaches the maximum possible delay of the device that includes the delay of both the wideband data buffer (that includes the differential transistor pair M1 and M2) and the cross-coupled differential pair (that includes the differential transistor pair M3 and M4).

Various embodiments of the invention presented herein provide for a large amount of delay to be incurred (which is selectable and variable, as desired in any of a wide variety of applications) with a minimal amount of signal quality degradation (i.e., minimal or no ISI).

One of many advantages of this novel design is that all the bandwidth extension techniques as referenced above with respect to a wideband data amplifier circuit having expanded bandwidth can be readily applied to the variable delay cell. In the embodiment 500 of FIG. 5, series input inductors L1 and L2, shunt peaking inductors L3 and L4, and negative miller capacitors C1 and C2 are all added so that the stage including differential transistor pair M1 and M2 can achieve high bandwidth with minimum increase of power. As the bandwidth of the buffer stage increases, a lower end of the delay value reduces and thus the variable delay range is increased without compromising the signal integrity. In addition, as the buffer stage becomes much faster than the cross-coupled differential pair stage, the predictions of the two-step approximation become more accurate.

By eliminating the double path (as depicted in the embodiment 400 of the FIG. 4), the embodiment 500 of the FIG. 5 shows an integrated delay cell that does not require the summing stage and thus reduces the power significantly. There is no extra capacitive loading added to the high speed path at the input. The additional capacitance due to the drains of the cross-coupled differential pair transistors at the output can be easily compensated by the shunt inductor. As a result, it is much easier to incorporate the integrated stage into the data path without compromising the signal integrity or degrading the impedance matching.

From the embodiment 500 of the FIG. 5, it is clear that the amount of delay can be changed continuously by implementing continuous control signals for the two current sources (i.e., using control block 530). A programmable delay cell can also be readily implemented by replacing the two current sources ($I_b$ and $I_r$) with a series of smaller current source, each can be turn on or off using digital control signals.

In summary, a fully differential current-controlled CMOS (C3MOS) integrated wideband delay cell is presented herein. At the buffer stage, bandwidth extension techniques such as shunt peaking, series inductive peaking can be readily applied to increase the range of the flat frequency response. A cross-coupled differential pair stage is added to the output of the buffer to add delay from input to output through the regenerative process of the cross-coupled differential transistor pair connected in a positive feedback configuration. The delay can be adjusted by varying the current distribution between the buffer stage and the cross-coupled differential pair stage. The integrated delay cell can then accommodate a large amount of delay while at the same time maintain a high bandwidth for the data path, without adding load to the input and without adding power consumption.

It is also noted that the methods described within the preceding figures can also be performed within any appropriate system and/or apparatus design (communication systems, communication transmitters, communication receivers, communication transceivers, and/or functionality described therein) without departing from the scope and spirit of the invention.

In view of the above detailed description of the invention and associated drawings, other modifications and variations will now become apparent. It should also be apparent that such other modifications and variations can be effected without departing from the spirit and scope of the invention.

What is claimed is:

1. A current-controlled CMOS (C3MOS) wideband variable delay cell circuit, the circuit comprising:
   a first differential transistor having a first source, a first gate, and a first drain;
   a second differential transistor having a second source that is directly coupled to the first source of the first differential transistor, a second gate, and a second drain;
   a first variable current source transistor such that a drain of the first variable current source transistor is directly coupled to the directly coupled first source and second source and a source of the first variable current source transistor is grounded;
   a first lumped input impedance component that is directly coupled between a first differential input of the C3MOS wideband variable delay cell circuit and the first gate of the first differential transistor;
   a second lumped input impedance component that is directly coupled between a second differential input of the C3MOS wideband variable delay cell circuit and the second gate of the second differential transistor;

a first output impedance, having a first output resistor and a first shunt peaking inductor connected in series, that is directly coupled between the first drain of the first differential transistor and a supply voltage;

a second output impedance, having a second output resistor and a second shunt peaking inductor connected in series, that is directly coupled between the second drain of the second differential transistor and the supply voltage;

a third differential transistor having a third source, a third gate, and a third drain;

a fourth differential transistor having a fourth source that is directly coupled to the third source of the third differential transistor, a fourth gate, and a fourth drain;

a second variable current source transistor such that a drain of the second variable current source transistor is directly coupled to the directly coupled third source and fourth source and a source of the second variable current source transistor is grounded; and a control module that:

adjusts a delay of the C3MOS wideband variable delay cell circuit by adjusting a first DC bias voltage provided to a gate of the first variable current source transistor to set a first DC bias current in the first variable current source transistor and by adjusting a second DC bias voltage provided to a gate of the second variable current source transistor to set a second DC bias current in the second variable current source transistor; and keeps a sum of the first DC bias current in the first variable current source transistor and the second DC bias current in the second variable current source transistor constant; and wherein:

the first lumped input impedance component and the second lumped input impedance component operate to perform bandwidth expansion of the wideband differential transistor pair;

the first drain of the first differential transistor, the third drain of the third differential transistor, and the fourth gate of the fourth differential transistor are directly coupled at a first node that is a first differential output of the C3MOS wideband variable delay cell circuit; and the second drain of the second differential transistor, the fourth drain of the fourth differential transistor, and the third gate of the third differential transistor are directly coupled at a second node that is a second differential output of the C3MOS wideband variable delay cell circuit.

2. The circuit of claim 1, further comprising:

a first capacitor that is coupled between the first drain of the first differential transistor and the second gate of the second differential transistor; and a second capacitor that is coupled between the second drain of the second differential transistor and the first gate of the first differential transistor.

3. The circuit of claim 1, wherein:

the first lumped input impedance component comprises a first series inductor; and the second lumped input impedance component comprises a second series inductor.

4. The circuit of claim 1, wherein:

the first output resistor of the first output impedance is coupled between the first drain of the first differential transistor and the first shunt peaking inductor of the first output impedance; and the first shunt peaking inductor of the first output impedance is coupled between the first output resistor of the first output impedance and the supply voltage.

5. The circuit of claim 1, wherein:

the first differential transistor, the second differential transistor, the third differential transistor, the fourth differential transistor, the first variable current source transistor, and the second variable current source transistor comprise NMOS (Negative-Channel Metal-Oxide Semiconductor) transistors.

6. The circuit of claim 1, wherein:

the first differential transistor, the second differential transistor, the third differential transistor, the fourth differential transistor, the first variable current source transistor, and the second variable current source transistor comprise PMOS (Positive-Channel Metal-Oxide Semiconductor) transistors.

7. The circuit of claim 1, wherein:

the control module keeps a DC level output of the first differential output of the C3MOS wideband variable delay cell circuit and the second differential output of the C3MOS wideband variable delay cell circuit constant by keeping the sum of the first DC bias current in the first variable current source transistor and the second DC bias current in the second variable current source transistor being constant.

8. The circuit of claim 1, wherein:

the delay of the C3MOS wideband variable delay cell circuit is a function of a ratio of the first DC bias current in the first variable current source transistor divided by the sum of the first DC bias current in the first variable current source transistor and the second DC bias current in the second variable current source transistor.

9. The circuit of claim 1, wherein:

the C3MOS wideband variable delay cell circuit is one delay cell of a plurality of delay cells implemented within an n-tap finite impulse response (FIR) filter.

10. A current-controlled CMOS (C3MOS) wideband variable delay cell circuit, the circuit comprising:

a wideband differential transistor pair having a first differential input, a second differential input, a first differential output, and a second differential output;

a first variable current source transistor, such that a drain of the first variable current source transistor is directly coupled to directly coupled sources of the wideband differential transistor pair and a source of the first variable current source transistor is grounded, that is operable to provide first DC bias current to the wideband differential transistor pair;

a cross-coupled differential transistor pair having a third differential input, a fourth differential input, a third differential output, and a fourth differential output;

a second variable current source transistor, such that a drain of the second variable current source transistor is directly coupled to directly coupled sources of the cross-coupled differential transistor pair and a source of the second variable current source transistor is grounded, that is operable to provide second DC bias current to the cross-coupled differential transistor pair;

a first lumped input impedance component that directly couples a first differential input signal to the first differential input of the wideband differential transistor pair;

a second lumped input impedance component that directly couples a second differential input signal to the second differential input of the wideband differential transistor pair;

a first output impedance that directly couples the first differential output of the wideband differential transistor pair to a power supply voltage;
a second output impedance that directly couples the second differential output of the wideband differential transistor pair to the power supply voltage; and
a control module that:
  adjusts a delay of the C3MOS wideband variable delay cell circuit by adjusting a first DC bias voltage provided to a gate of the first variable current source transistor to set the first DC bias current in the first variable current source transistor and by adjusting a second DC bias voltage provided to a gate of the second variable current source transistor to set the second DC bias current in the second variable current source transistor; and
  keeps a sum of the first DC bias current in the first variable current source transistor and the second DC bias current in the second variable current source transistor constant; and wherein:
the first lumped input impedance component and the second lumped input impedance component operate to perform bandwidth expansion of the wideband differential transistor pair;
the second differential output of the wideband differential transistor pair, the third differential input of the cross-coupled differential transistor pair, and the third differential output of the cross-coupled differential transistor pair are directly coupled at a first node that is a first differential output of the C3MOS wideband variable delay cell circuit; and
the first differential output of the wideband differential transistor pair, the fourth differential input of the cross-coupled differential transistor pair, and the fourth differential output of the cross-coupled differential transistor pair are directly coupled at a second node that is a second differential output of the C3MOS wideband variable delay cell circuit.

11. The circuit of claim 10, wherein:
the delay of the C3MOS wideband variable delay cell circuit is a function of a ratio of the first DC bias current in the first variable current source transistor divided by the sum of the first DC bias current in the first variable current source transistor and the second DC bias current in the second variable current source transistor.

12. The circuit of claim 10, wherein:
the wideband differential transistor pair comprises:
  a first differential transistor having a first source, a first gate that comprises the first differential input of the wideband differential transistor pair, and a first drain that comprises the second differential output of the wideband differential transistor pair;
  a second differential transistor having a second source, a second gate that comprises the second differential input of the wideband differential transistor pair, and a second drain that comprises the first differential output of the wideband differential transistor pair; and
  wherein the drain of the first variable current source transistor is directly coupled to the first source of the first differential transistor and to the second source of the second differential transistor;
the cross-coupled differential transistor pair comprises:
  a third differential transistor having a third source, a third gate, and a third drain;
  a fourth differential transistor having a fourth source, a fourth gate, and a fourth drain; and
  wherein the drain of the second variable current source transistor is directly coupled to the third source of the third differential transistor and to the fourth source of the fourth differential transistor;
the first drain of the first differential transistor, the third drain of the third differential transistor, and the fourth gate of the fourth differential transistor are directly coupled; and
the second drain of the second differential transistor, the fourth drain of the third differential transistor, and the third gate of the third differential transistor are directly coupled.

13. The circuit of claim 10, wherein:
a first capacitor that is coupled between the first differential input of the wideband differential transistor pair and the first differential output of the wideband differential transistor pair; and
a second capacitor that is coupled between the second differential input of the wideband differential transistor pair and the second differential output of the wideband differential transistor pair.

14. The circuit of claim 10, wherein:
the first lumped input impedance component comprises a first series inductor; and
the second lumped input impedance component comprises a second series inductor.

15. The circuit of claim 10, wherein:
the first output impedance comprises a first output resistor and a first shunt peaking inductor connected in series; and
the second output impedance comprises a second output resistor and a second shunt peaking inductor connected in series.

16. A current-controlled CMOS (C3MOS) wideband variable delay cell circuit, the circuit comprising:
a first differential transistor having a first source, a first gate, and a first drain;
a second differential transistor having a second source that is directly coupled to the first source of the first differential transistor, a second gate, and a second drain;
a first variable current source transistor such that a drain of the first variable current source transistor is directly coupled to the directly coupled first source and second source and a source of the first variable current source transistor is grounded;
a first series inductor that is directly coupled between a first differential input of the C3MOS wideband variable delay cell circuit and the first gate of the first differential transistor;
a second series inductor that is directly coupled between a second differential input of the C3MOS wideband variable delay cell circuit and the second gate of the second differential transistor;
a first output impedance, having a first output resistor and a first shunt peaking inductor connected in series, such that the first output resistor is directly coupled between the drain of the first differential transistor and the first shunt peaking inductor, and the first shunt peaking inductor is directly coupled between the first output resistor and a supply voltage;
a second output impedance, having a second output resistor and a second shunt peaking inductor connected in series, such that the second output resistor is directly coupled between the drain of the second differential transistor and the second shunt peaking inductor, and the second shunt peaking inductor is directly coupled between the second output resistor and the supply voltage;

a first capacitor that is directly coupled between the drain of the first differential transistor and the gate of the second differential transistor;

a second capacitor that is directly coupled between the drain of the second differential transistor and the gate of the first differential transistor;

a third differential transistor having a third source, a third gate, and a third drain;

a fourth differential transistor having a fourth source that is directly coupled to the third source of the third differential transistor, a fourth gate, and a fourth drain;

a second variable current source transistor such that a drain of the second variable current source transistor is directly coupled between the directly coupled third source and fourth source and a source of the second variable current source transistor is grounded; and a control module that:

adjusts a delay of the C3MOS wideband variable delay cell circuit by adjusting a first DC bias voltage provided to a gate of the first variable current source transistor to set a first DC bias current in the first variable current source transistor and by adjusting a second DC bias voltage provided to a gate of the second variable current source transistor to set a second DC bias current in the second variable current source transistor; and keeps a sum of the first DC bias current in the first variable current source transistor and the second DC bias current in the second variable current source transistor constant; and wherein:

the first drain of the first differential transistor, the third drain of the third differential transistor, and the fourth gate of the fourth differential transistor are directly coupled at a first node that is a first differential output of the C3MOS wideband variable delay cell circuit; and the second drain of the second differential transistor, the fourth drain of the fourth differential transistor, and the third gate of the third differential transistor are directly coupled at a second node that is a second differential output of the C3MOS wideband variable delay cell circuit.

17. The circuit of claim 16, wherein:

the control module keeps a DC level output of the first differential output of the C3MOS wideband variable delay cell circuit and the second differential output of the C3MOS wideband variable delay cell circuit constant by keeping the sum of the first DC bias current in the first variable current source transistor and the second DC bias current in the second variable current source transistor being constant.

18. The circuit of claim 16, wherein:

the delay of the C3MOS wideband variable delay cell circuit is a function of a ratio of the first DC bias current in the first variable current source transistor divided by the sum of the first DC bias current in the first variable current source transistor and the second DC bias current in the second variable current source transistor.

19. The circuit of claim 16, wherein:

the C3MOS wideband variable delay cell circuit is one delay cell of a plurality of delay cells implemented within an n-tap finite impulse response (FIR) filter.

20. The circuit of claim 16, wherein:

the first differential transistor, the second differential transistor, the third differential transistor, the fourth differential transistor, the first variable current source transistor, and the second variable current source transistor comprise NMOS (Negative-Channel Metal-Oxide Semiconductor) transistors or PMOS (Positive-Channel Metal-Oxide Semiconductor) transistors.

* * * * *